(12) United States Patent
Collins et al.

(10) Patent No.: US 12,512,396 B2
(45) Date of Patent: Dec. 30, 2025

(54) FLEXIBLE DIE TO FLOOR PLANNING WITH BUMP PITCH SCALE THROUGH GLASS CORE VIA PITCH

(71) Applicant: Intel Corporation, Santa Clara, CA (US)

(72) Inventors: Andrew Collins, Chandler, AZ (US); Srinivas V. Pietambaram, Chandler, AZ (US); Tarek A. Ibrahim, Mesa, AZ (US); Aleksandar Aleksov, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 950 days.

(21) Appl. No.: 17/485,248

(22) Filed: Sep. 24, 2021

(65) Prior Publication Data

US 2023/0099632 A1 Mar. 30, 2023

(51) Int. Cl.
*H01L 23/48* (2006.01)
*H01L 23/15* (2006.01)
*H01L 23/498* (2006.01)
*H10D 89/10* (2025.01)

(52) U.S. Cl.
CPC ........ *H01L 23/49816* (2013.01); *H01L 23/15* (2013.01); *H01L 23/49822* (2013.01); *H01L 23/49838* (2013.01); *H10D 89/10* (2025.01)

(58) Field of Classification Search
None
See application file for complete search history.

(56) References Cited

U.S. PATENT DOCUMENTS

| | | | |
|---|---|---|---|
| 2007/0086262 A1* | 4/2007 | Verma | H10D 89/10 257/E27.11 |
| 2018/0102338 A1* | 4/2018 | McLellan | H05K 3/368 |
| 2019/0051633 A1* | 2/2019 | Bhagavat | H01L 23/5385 |
| 2019/0089036 A1* | 3/2019 | Kamgaing | H01P 5/087 |
| 2020/0013693 A1* | 1/2020 | Lambert | H01L 21/4853 |
| 2020/0075541 A1* | 3/2020 | Sturcken | H01L 23/481 |
| 2020/0098724 A1* | 3/2020 | Liff | H01L 23/36 |
| 2022/0222198 A1* | 7/2022 | Lanka | G06F 13/4273 |

* cited by examiner

*Primary Examiner* — Nicholas J Tobergte
(74) *Attorney, Agent, or Firm* — Schwabe, Williamson & Wyatt P.C.

(57) ABSTRACT

Embodiments disclosed herein include disaggregated die modules. In an embodiment, a disaggregated die module comprises a plurality of core logic blocks. In an embodiment, the disaggregated die module further comprises a first IO interface, where the first IO interface is adjacent to an edge of the disaggregated die module, and a second IO interface, where the second IO interface is set away from the edge of the disaggregated die module.

16 Claims, 13 Drawing Sheets

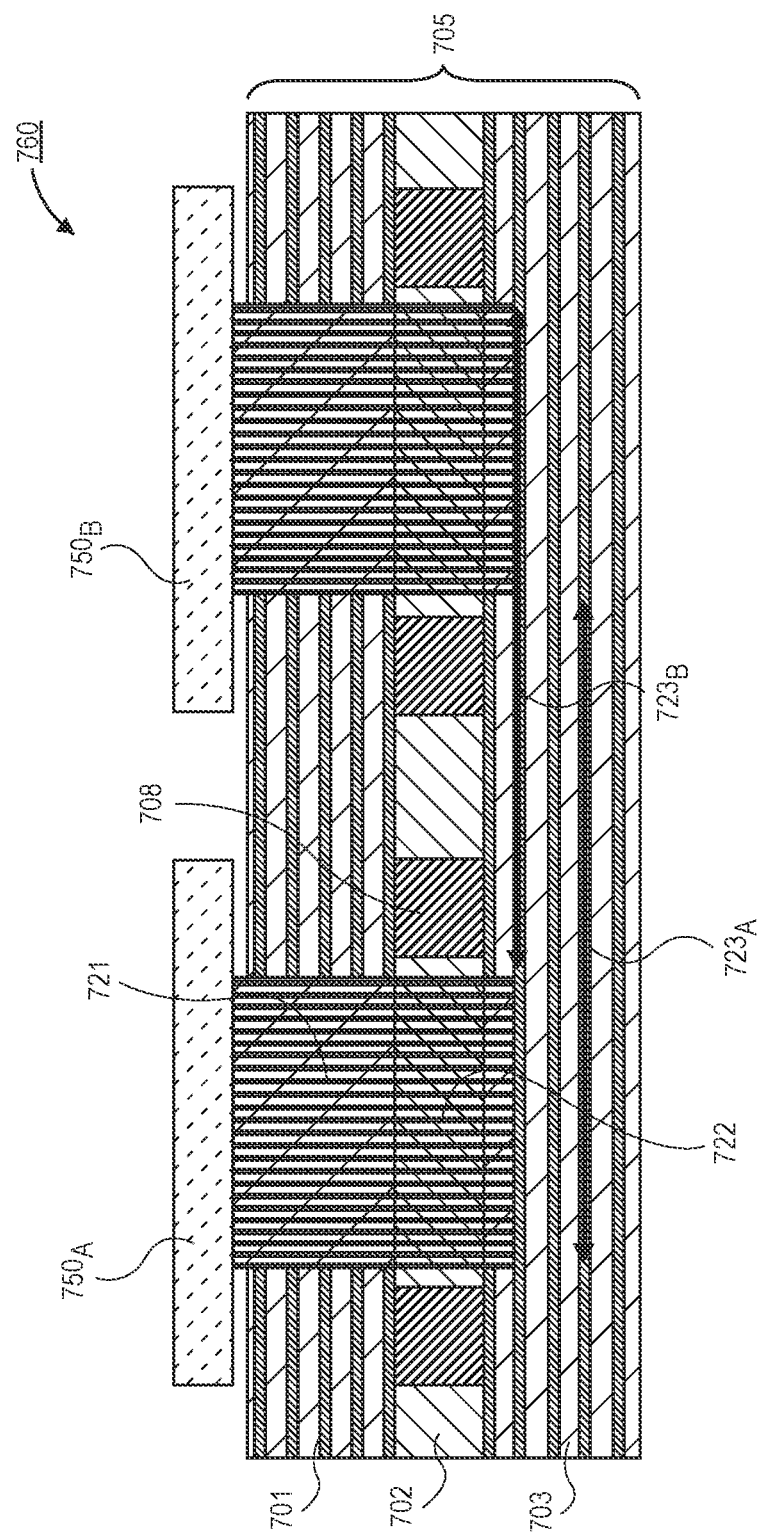

FLEXIBLE DIE TO FLOOR PLANNING WITH BUMP PITCH SCALE THROUGH GLASS CORE VIA PITCH

TECHNICAL FIELD

Embodiments of the present disclosure relate to electronic packages, and more particularly to electronic packages that enable first level interconnect (FLI) bump pitch scale through glass core vias.

BACKGROUND

Standard organic substrates fan-out die first level interconnect (FLI) bump-scale pitches (e.g., 100 μm to 150 μm) to larger second level interconnect (SLI) pitches (e.g., 400 μm to 1,000 μm). For large die to package ratios where the space is constrained for signal fan-out between the die and package edge, the substrate layer counts can be driven by the footprint of the high-density front side signal routing. Typically, the core has laser through hole (LTH) or plated through hole (PTH) vias. LTH via pitch is generally limited to 2×-3× the FLI pitch for standard die to organic package chip attach FLI. PTH via pitch is generally limited to 3×-4× FLI pitch for standard die to organic package chip attach FLI.

On standard organic packages with large die complexes, signals are forced to fan-out from the die shadow bump field on the front side layers in order to accommodate the pitches of the LTH vias or PTH vias through the core. On the backside layers those signals must route back to the SLI land locations under the die shadow. This front side fan-out and backside fan-in routing strategy forces high substrate layer counts with very high front side layer routing densities. The substrate layer count overhead with this routing strategy negatively impacts unit cost, substrate capacity loading, manufacturability, and yield.

An additional issue, the IO interfaces have a strict requirement to be positioned on the die edge. By forcing the IO interfaces on the die edge, the die floor plan flexibility for optimal die fit (and die size) and optimal performance is limited. Some die sizes are "shoreline limited" in that the requirement of placing IO interfaces on the die edge is driving the die size as opposed to the overall circuit area requirement.

BRIEF DESCRIPTION OF THE DRAWINGS

FIG. 7A is a cross-sectional illustration of an electronic package with a first die module that is electrically coupled to a second die module with signal connectivity on the backside metal layers of the substrate after passing through glass core vias, in accordance with an embodiment.

EMBODIMENTS OF THE PRESENT DISCLOSURE

Described herein are electronic packages that enable first level interconnect (FLI) bump pitch scale through glass core vias, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, routing through package substrates is currently extremely limited by the size of vias through the core of the package substrate. Typically, plated through hole (PTH) vias or laser through hole (LTH) vias have pitches that are between 2× and 4× of the FLI pitch. As such, the routing on the front side of the package substrate needs to fan-out to accommodate those large pitches. Additionally, due to the limited routing area outside the die shadow, many layers are needed.

Accordingly, embodiments disclosed herein include package substrates that utilize a glass core. The glass core enables the formation of through core vias that have a pitch that substantially matches the pitch of the FLI bumps. For example, "substantially matches" may include 0.50× FLI pitch to 1.50× FLI pitch. As such, there is no need to fan-out in the front side layers of the package substrate. Instead, a portion of the fan-out and other routing has the option to occur on the backside of the package substrate where the routing is less constrained by power routing.

Figure 1A:
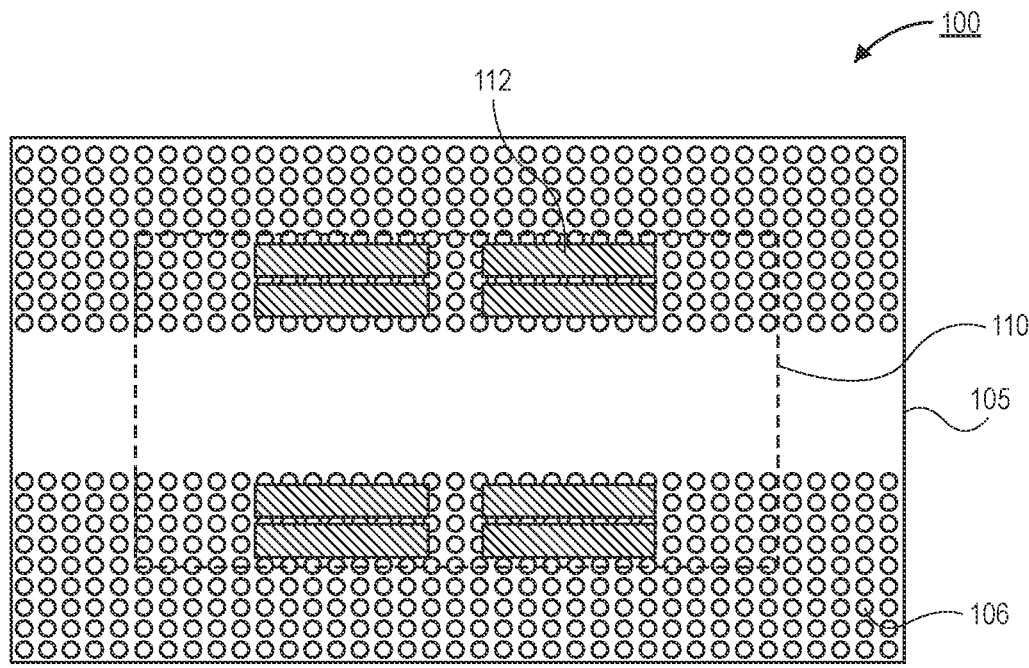
FIG. 1A is a plan view illustration of an example of IO interfaces on a die and the underlying second level interconnects (SLIs) below the package substrate, in accordance with an embodiment.

Referring now to FIG. 1A, a plan view illustration of an electronic package 100 is shown, in accordance with an embodiment. As shown, a package substrate 105 may include a plurality of SLI pads 106. The SLI pads 106 are on the backside of the package substrate 105. In an embodiment, one or more die modules 110 are provided over the package substrate 105. The die module 110 is illustrated with a dashed box to indicate it is see-through in order to not obscure the underlying features. In an embodiment, the die module 110 may comprise a plurality of 10 interfaces 112. The TO interfaces 112 may be coupled to the underlying SLI pads 106 through routing (not shown) in the package substrate 105.

As shown, the SLI pads 106 are provided outside of the footprint of the die module 110 and inside the footprint of the die module 110. With existing routing architectures including organic cores with PTH vias or LTH vias, the routing to couple TO interfaces 112 to some SLI pads 106 requires a fan-out on the front side layers and a fan-in on the backside layers in order to reach the SLI pads 106 within the die module footprint.

Figure 1B:
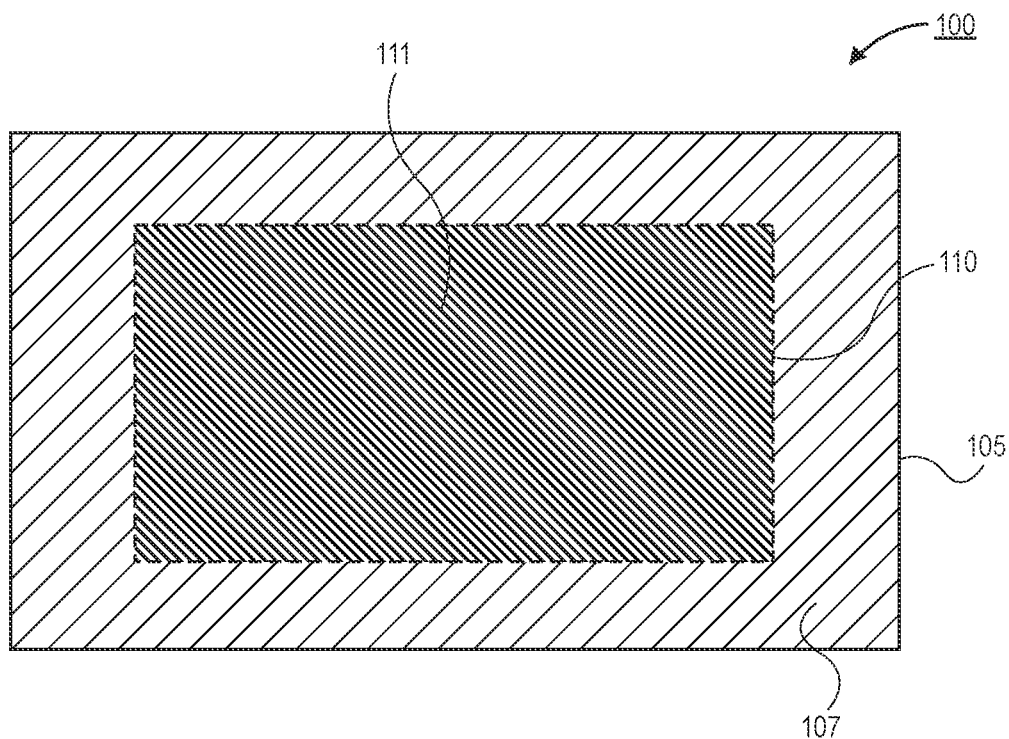
FIG. 1B is a plan view illustration of a die over a package substrate, with the routing density variation between a center and an edge of the package substrate, in accordance with an embodiment.

Additionally, front side substrate layers outside the die module shadow can exhibit low copper densities relative to the copper density under the die shadow due to the high-density signal routing between the die module edge and the package edge. This conflicts with the high copper density required under the die shadow for core and IO power delivery. For example, in FIG. 1B the electronic package 100 illustrates the routing density within the die module shadow 110 and outside the die module shadow 110. As shown, the interior region 111 can have a copper density that is approximately 90% or more. As used herein, approximately refers to a value that is within 10% of the stated value. For example, approximately 90% may refer to a value between 81% and 99%. In an embodiment, the outer region 107 may have a copper density that is between approximately 20% and approximately 40%. In a particular embodiment, the outer region 107 may have localized areas (e.g., 1 mm×1 mm regions) of low copper density of approximately 20% to approximately 40% with other localized areas within that layer greater than the 20% to 40% range.

The copper density imbalance between inside and outside of the die shadow 110 creates challenges with maintaining copper plating uniformity with an additive substrate etching process used for substrate fabrication. The copper ends up plating thicker on the low-density regions and thinner on the high-density regions. This results in large copper thickness deltas within the front side routing layers and can lead to yield loss and large variations in signal electrical characteristics.

The split in localized signal routing densities between the front side and backside metal layers of a package substrate in large die complexes is typically unbalanced in a standard substrate stack-up. Signals are typically forced to break out from the die shadow to LTH or PTH locations outside of the die shadow before dropping down to the backside layers for routing to land locations, some of which are deep under the die shadow.

Figure 2A:
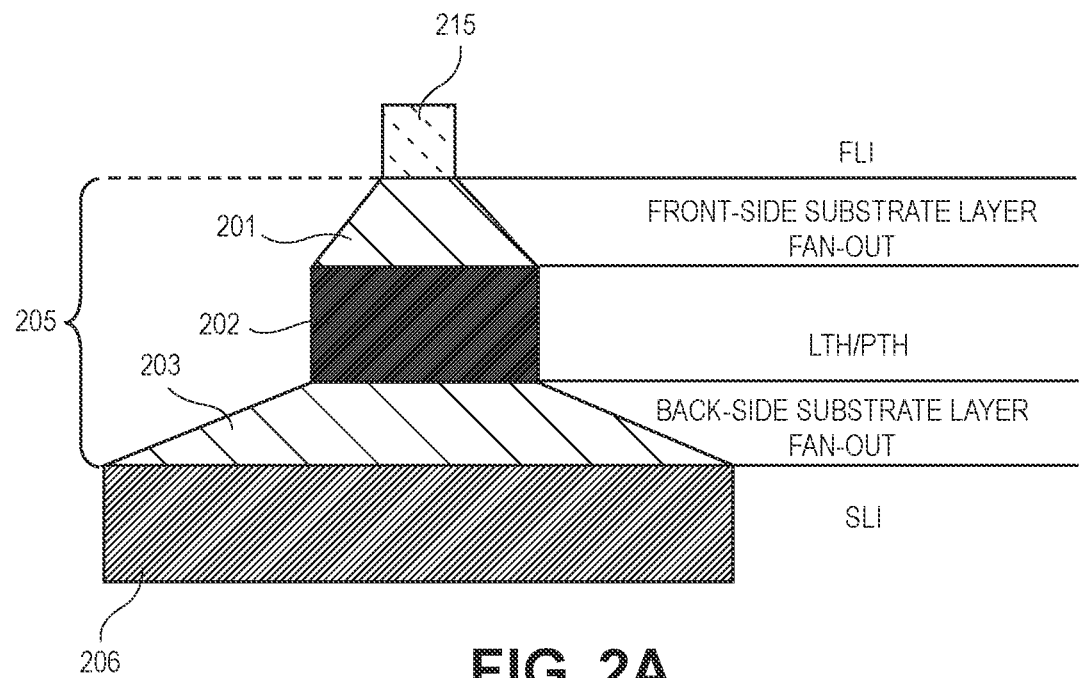
FIG. 2A is an illustration that depicts the relative pitch transitions throughout the package stack-up from FLI to SLI, in accordance with an embodiment.

Referring now to FIG. 2A, an illustration of the standard signal pitch fan-out through an organic substrate stack-up is shown, in accordance with an embodiment. As shown, the routing may begin at a FLI 215. The FLI pitch is typically between 100 μm and 150 μm. Within the package substrate 205, the front side layers 201 then provide a fan-out to a pitch of the LTH or PTH in the core 202. That is, signals cannot pass through the core 202 until they are fanned out to the LTH/PTH pitch. For example, the LTH vias may have a pitch of approximately 250 μm or greater, and the PTH vias may have a pitch of approximately 350 μm or greater. Accordingly, existing core vias function as a bottleneck that limits routing flexibility in the package substrate 205. Having to fan-out the signals on the limited front side layers in the constrained space between the die edge and the package outline 205 to the larger through core via pitch forces very high localized signal routing densities. Once the signal reaches the backside layers 203, the pitch may be further expanded to the pitch of the SLIs 206. For example, the SLI pitch may be between approximately 400 μm (e.g., in mobile applications) and approximately 1,000 μm (e.g., in data center applications).

Large die complexes force many of the package signal lands well under the die shadow. Signals break out on the front side layers and back in on the backside layers. This routing scheme is inefficient and leads to higher layer counts with the front side routing requirement dominating the total substrate layer count requirement. A schematic of such a routing scheme is shown in FIG. 2B.

Figure 2B:
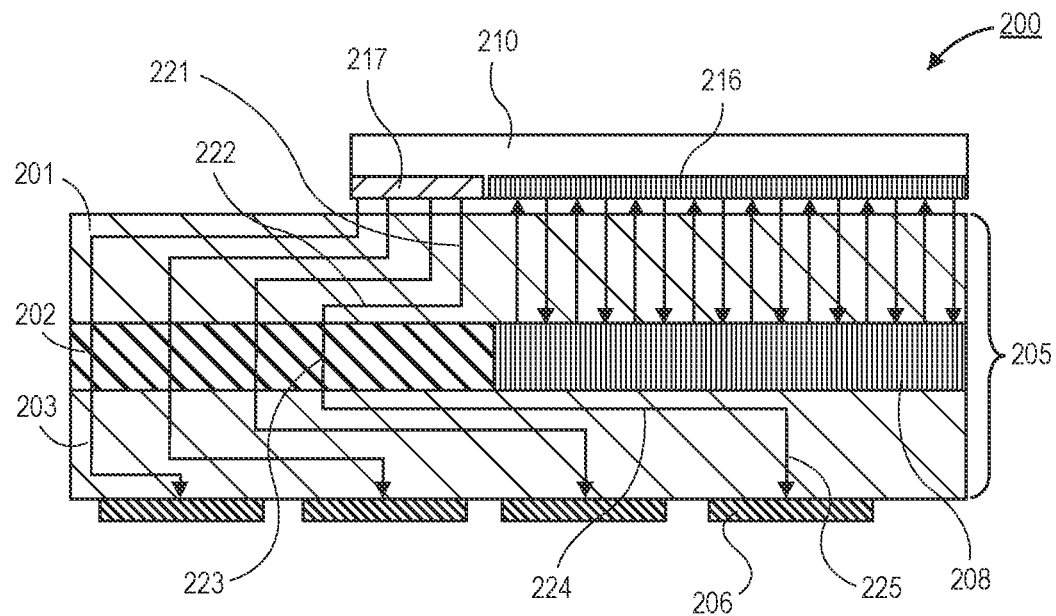
FIG. 2B is a cross-sectional illustration of an electronic package with a fan-out above the organic core and a fan-in under the die shadow below the organic core, in accordance with an embodiment.

Referring now to FIG. 2B, a cross-sectional illustration of an electronic package 200 is shown, in accordance with an embodiment. The electronic package 200 may comprise a package substrate 205 with a die 210 over the package substrate 205. The die 210 may include an IO interface 217 and a logic core 216. The logic core 216 is coupled to power circuitry 208 in the core 202 of the package substrate 205. The power circuitry 208 may include discrete devices such as voltage regulator chiplets, capacitors or inductors (e.g., in support of integrated voltage regulator solutions (e.g., FIVR)). In an embodiment, the IO interface 217 is coupled to SLI pads 206. As shown, some of the SLI pads 206 may be positioned within the die shadow of the die 210. As such, routing must break out in the front side layers and break back in on the backside layers 203.

As an example, the signal path may include portions 221-225. In an embodiment, a first portion 221 may include a vertical component in the front side layers 201. A second portion 222 includes a horizontal component in the front side layers 201. The second portion 222 is a break out portion that translates the pitch to the pitch necessary to pass through the core 202. Portion 223 is a via that passes through the core 202. The portion 223 may be a PTH via or a LTH via. As shown, the portion 223 may be outside the footprint of the die 210. In an embodiment, the signal path may continue with portion 224. Portion 224 is a break in portion that routs the signal path back under the die shadow. A vertical portion 225 may couple the signal path to the SLI pad 206.

Figure 2C:
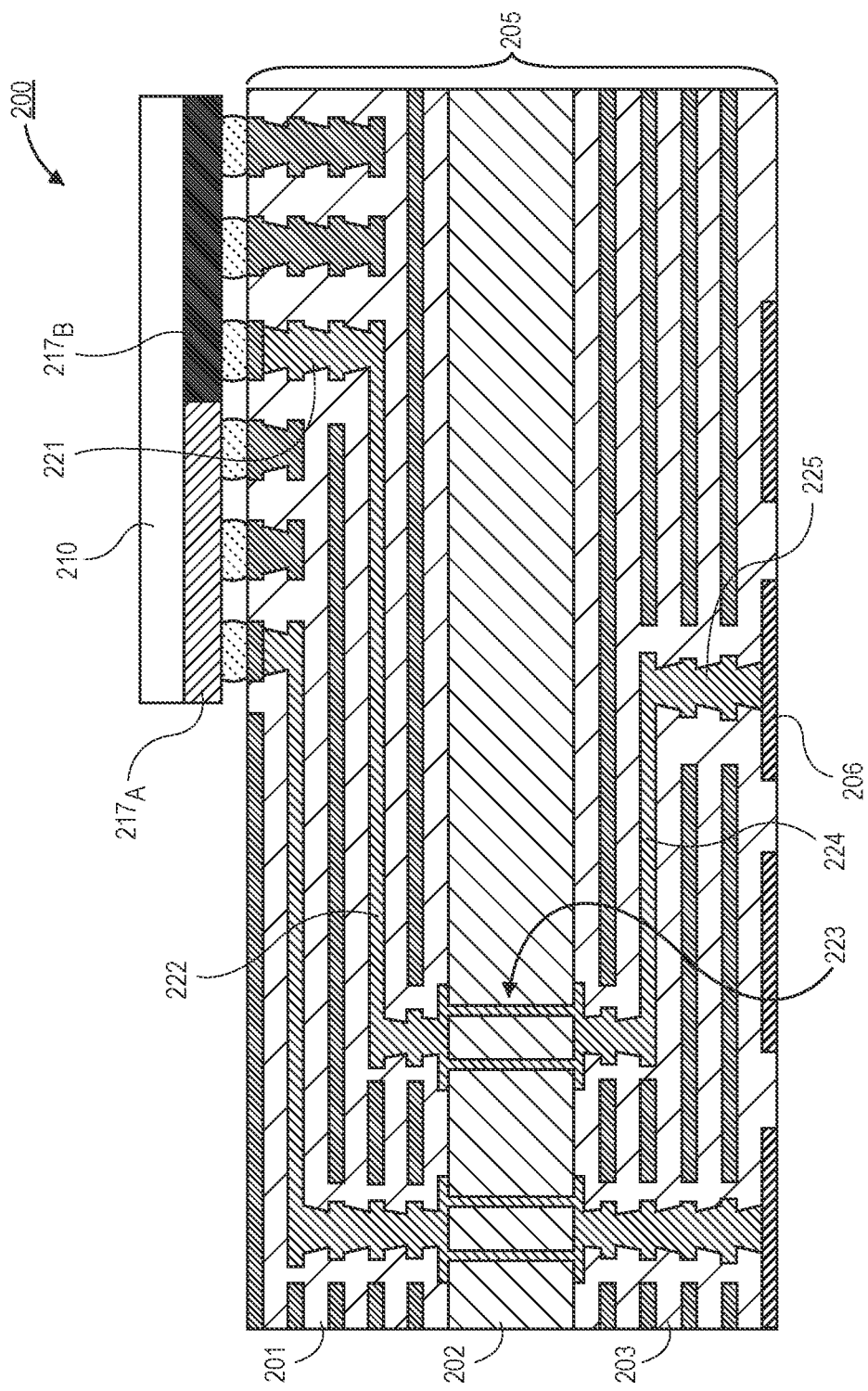
FIG. 2C is a detailed cross-sectional illustration of an electronic package with a fan-out above the core and a fan-in below the core, in accordance with an embodiment.

Referring now to FIG. 2C, a cross-sectional illustration of an electronic package 200 that shows more detail of the routing architecture is shown, in accordance with an embodiment. As shown, the die 210 comprises a first IO interface 217A and a second IO interface 217B. As shown, a first portion 221 of the signal path includes pads and vias to vertically displace the signal path into the front side layers 201. A second portion 222 may be a trace that laterally displaces the signal path to outside the footprint of the die 210. A third portion 223 of the signal path includes a PTH or LTH that passes through the core 202. A fourth portion 224 of the signal path may be a trace that brings the signal path back in below the shadow of the die 210. A fifth portion 225 may comprise pads and vias in order to extend the signal path to an SLI pad 206.

As demonstrated in FIGS. 2A-2C, the routing is significantly restricted by the bottleneck at the package substrate core. That is, the routing needs to first fan out before the core and then fan back in after the core in order to reach SLI pads that are provided below the die shadow. Accordingly, embodiments disclosed herein include package substrates with alternative core designs. For example, instead of an organic core, embodiments include a glass core. The glass core may be patterned in order to form vias with a fine pitch. In some embodiments, the glass core may support vias that have a pitch that is substantially equal to a pitch of the FLI pads.

Figure 3A:
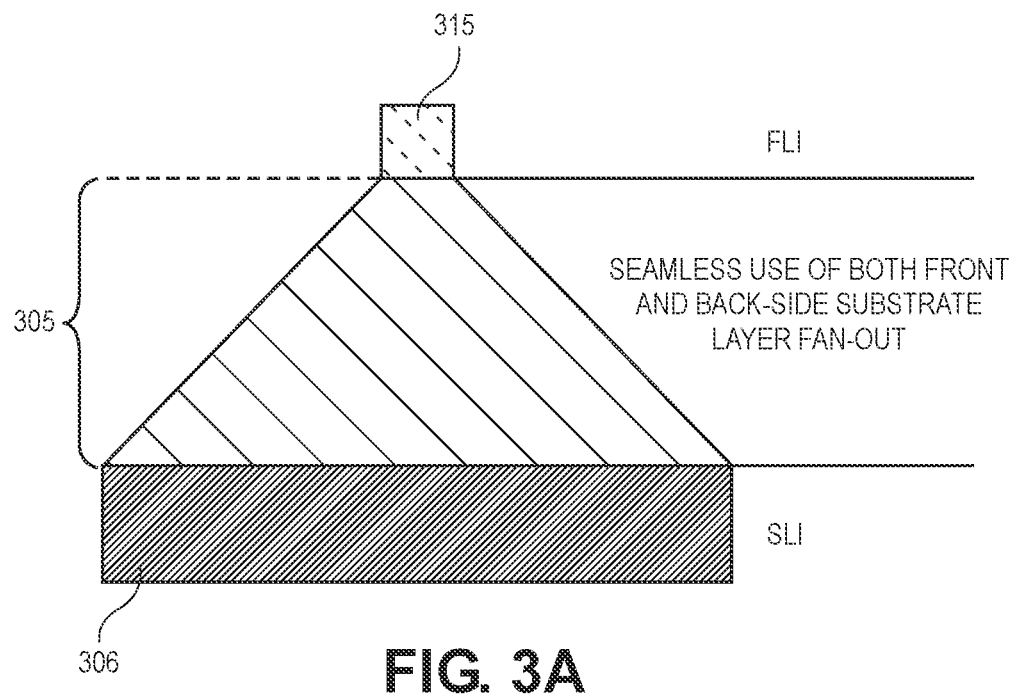
FIG. 3A is an illustration that depicts the absence of any pitch transition bottlenecks in the routing through a glass core, in accordance with an embodiment.

Referring now to FIG. 3A, an illustration of the routing requirements in accordance with embodiments disclosed herein is shown. Between the FLI 315 and the SLI 306, the pitch fan-out routing in the package substrate 305 does not include any bottlenecks. In the proposed stack-up the through core pitch transition is avoided. This allows for all of the substrate routing layers (front side and backside) to be utilized interchangeably. This provides more flexibility in the routing and can be used to avoid the fan-out/fan-in architecture that is necessary when PTH vias or LTH vias are used.

Figure 3B:
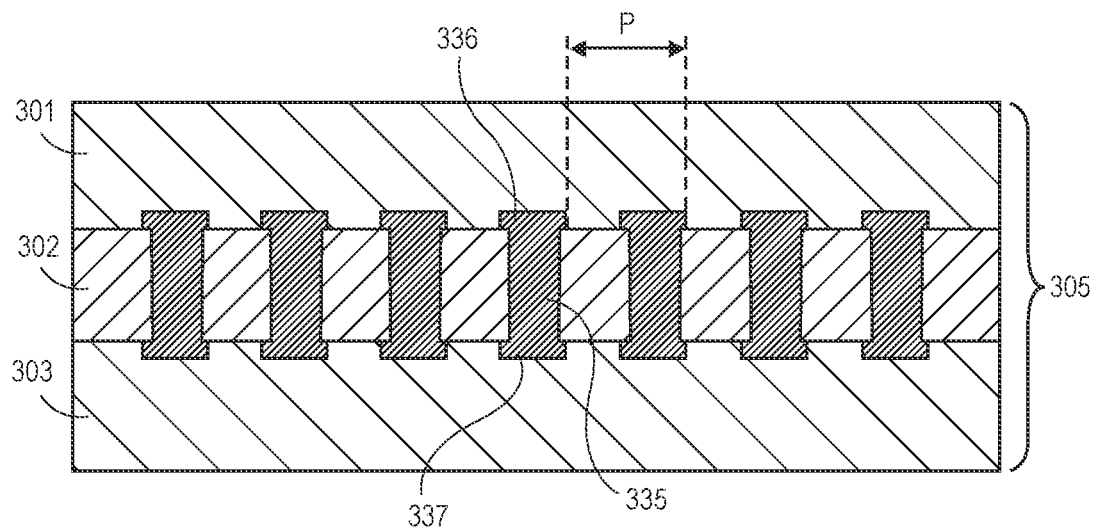
FIG. 3B is a cross-sectional illustration of a package substrate with a glass core and vias through the glass core, in accordance with an embodiment.

Referring now to FIG. 3B, a cross-sectional illustration of a package substrate 305 is shown, in accordance with an embodiment. In an embodiment, the package substrate 305 comprises front side layers 301 and backside layers 303. The front side layers 301 and the backside layers 303 may be dielectric layers laminated over each other. Conductive routing (not shown) may pass through the front side layers 303 and the backside layers 301.

In an embodiment, the front side layers 301 are over a core 302 and the backside layers 303 are under the core 302. In an embodiment, the core 302 comprises glass. That is, the core 302 may be considered a glass core. In an embodiment, the glass material may be a glass that is suitable for patterning to form through glass vias 335 that have a small pitch. For example, the pitch P may be equal to a FLI pitch. In some embodiments, the pitch P may be approximately 150 μm or smaller, or approximately 100 μm or smaller.

In the illustrated embodiment, the through glass vias 335 may have a vertical section that passes through the core 302. A pad 336 may be over the core 302 in the front side layers 301, and a pad 337 may be under the core 302 in the backside layers 303. In an embodiment, the through glass via 335 may have substantially vertical sidewalls. However, it is to be appreciated that in some embodiments, the sidewalls may be non-vertical.

Figure 3C:
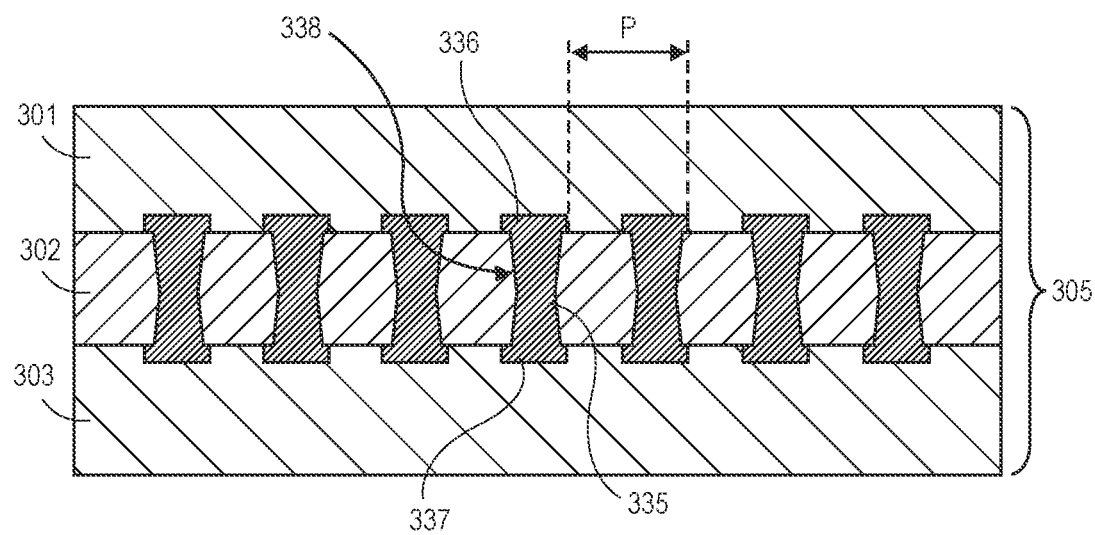
FIG. 3C is a cross-sectional illustration of a package substrate with a glass core and vias through the glass core with an hourglass shaped cross-section, in accordance with an embodiment.
Figure 3D:
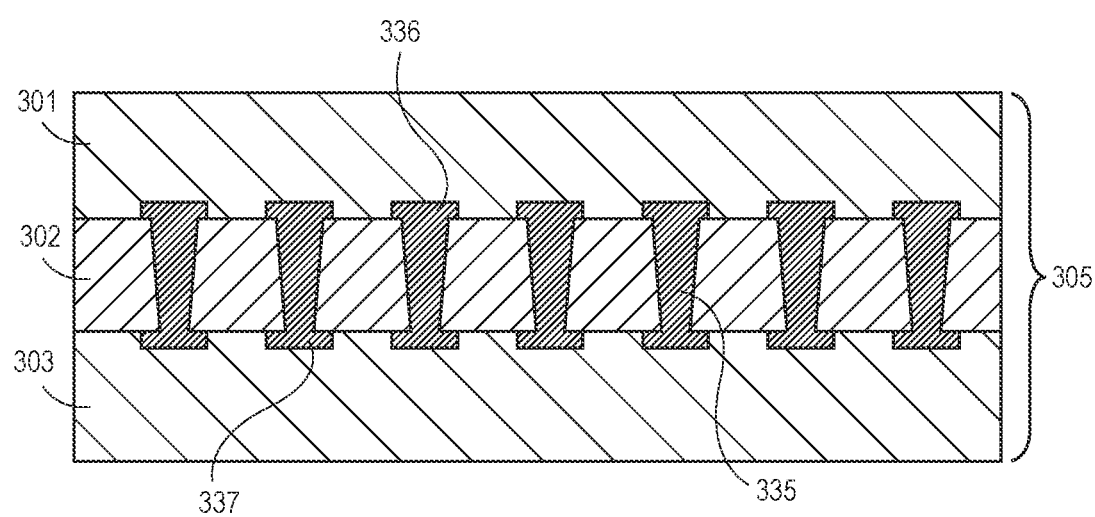
FIG. 3D is a cross-sectional illustration of a package substrate with a glass core and vias through the glass core with a positive tapered cross-section, in accordance with an embodiment.
Figure 3E:
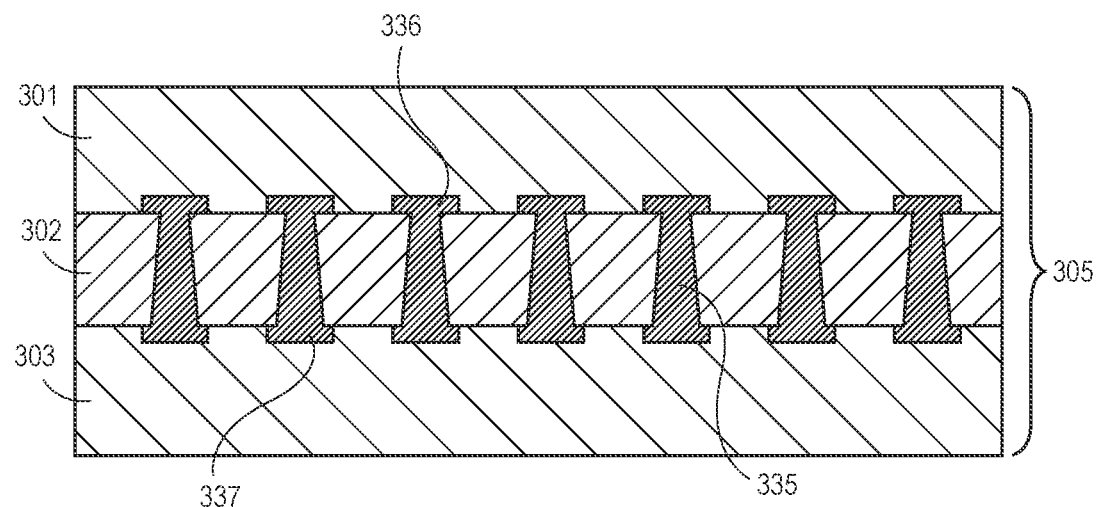
FIG. 3E is a cross-sectional illustration of a package substrate with a glass core and vias through the glass core with a negative tapered cross-section, in accordance with an embodiment.

Referring now to FIG. 3C, a cross-sectional illustration of a package substrate 305 is shown, in accordance with an additional embodiment. In an embodiment, the package substrate 305 may be substantially similar to the package substrate 305 described above with respect to FIG. 3B, with the exception of the through glass vias 335. Instead of having vertical sidewalls, the through glass via 335 has sidewalls 338 that are sloped. In a particular embodiment, the sidewalls 338 provide an hourglass shaped cross-section for the through glass vias 335. An hourglass shaped cross-section may refer to a shape that has wide ends that taper to a smaller width in the middle of the through glass via 335. In other embodiments, the sidewalls 338 may have a constant taper through the entire thickness of the through glass via 335. For example, a top end of the through glass via 335 may be wider than a bottom end of the through glass via. For example, in FIG. 3D, the vias 335 have a taper with a wider end at the front side pads 336, and in FIG. 3E, the vias 335 have a taper with a wider end at the back side pads 337.

In an embodiment, the through glass vias may be formed with any suitable process. In a particular embodiment, the through glass vias are formed with a laser assisted etching process. In such an embodiment, a laser exposes portions of the glass core 302. The exposed region of the glass core 302 undergoes a morphological change. For example, the microstructure of the exposed glass core 302 may switch from amorphous to crystalline. The crystalline microstructure may be more susceptible to an etching process (e.g., a wet etch) to selectively remove the exposed regions of the glass core 302. The resulting holes can be plated to form the through glass vias 335. In embodiments with an hourglass shaped cross section, the laser exposure may be made on both surfaces of the glass core 302 (i.e., from above and below). In an embodiment, the laser assisted etching process enables the formation of through glass vias 335 that have a width that is approximately 100 μm or smaller. In the case of a glass core 302 with a thickness between 100 μm and 750 μm, the through glass vias 335 may have a pitch between approximately 50 μm and approximately 400 μm, or between approximately 50 μm and approximately 150 μm.

Figure 4A:
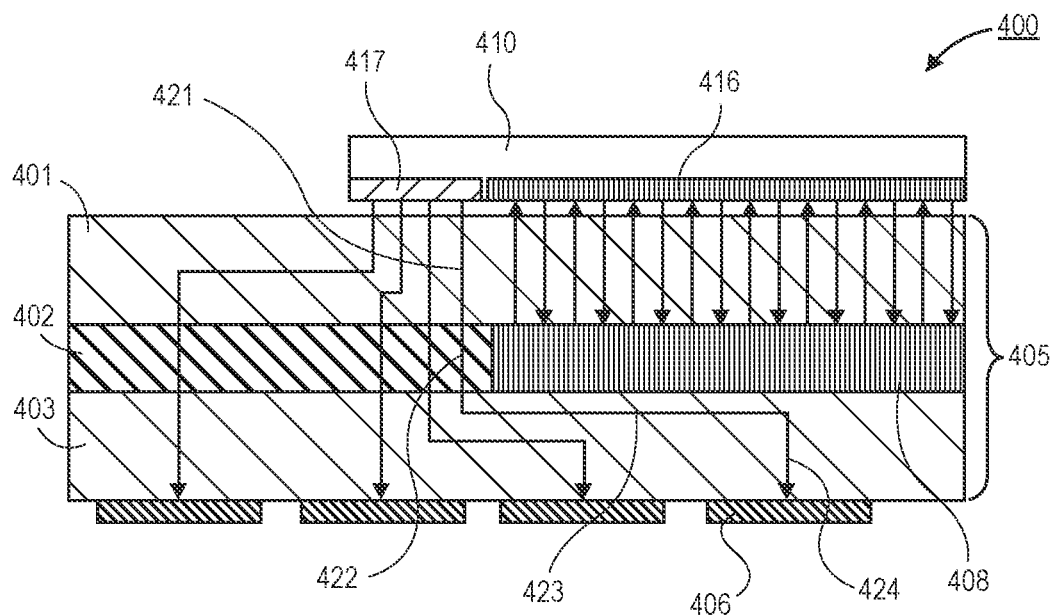
FIG. 4A is a cross-sectional illustration of an electronic package with signal through core paths that are vertical under the IO interface, in accordance with an embodiment.

Referring now to FIG. 4A, a cross-sectional schematic of an electronic package 400 is shown, in accordance with an embodiment. In an embodiment, the electronic package 400 comprises a package substrate 405 with a die 410 over the package substrate 405. In an embodiment, the package substrate 405 comprises front side layers 401, a core 402, and backside layers 403. In an embodiment, the core 402 may comprise glass. That is, the core 402 may be a glass core. In an embodiment, the die 410 comprises an IO interface 417 and a logic core 416. The logic core 416 may be coupled to power circuitry 408 in the core 402. The power circuitry 408 may include discrete devices such as voltage regulator chiplets, capacitors or inductors (e.g., in support of integrated voltage regulator solutions (e.g., FIVR)).

In an embodiment, the IO interface 417 may be coupled to SLI pads 406 over the backside layers 403 of the package substrate 405 by signal paths. Due to the large size of the die 410, some of the SLI pads 406 may be within the shadow of the die 410. In an embodiment, the signal paths may utilize the flexibility provided by through glass vias. For example, a signal path may include a first portion 421. The first portion 421 may be a vertical path only. That is, the first portion 421 may include no lateral component. In an embodiment, the first portion 421 connects to a second portion 422. The second portion 422 may be a through glass via. In a particular embodiment, the through glass via has a pitch that substantially matches the FLI pitch of the die 410. After passing through the core 402, a third portion 423 of the signal path may have a lateral component. The third portion 423 may extend the signal path further below the shadow of the die 410 in order to reach the SLI pad 406. A vertical fourth portion 424 may connect the third portion 423 to the SLI pad 406.

Figure 4B:
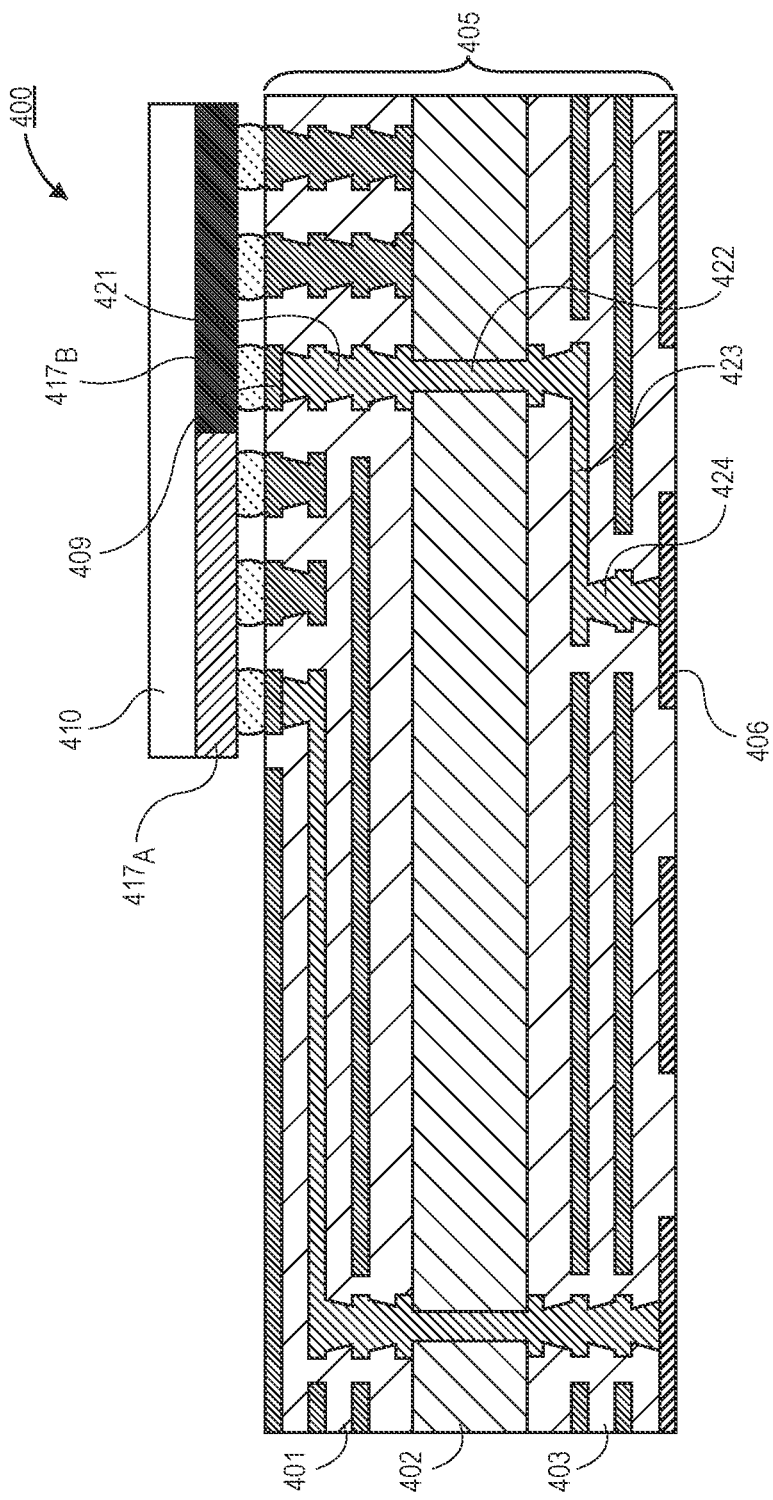
FIG. 4B is a detailed cross-sectional illustration of an electronic package with signal through core paths that are vertical under the IO interface, in accordance with an embodiment.

Referring now to FIG. 4B, a cross-sectional illustration of an electronic package 400 is shown, in accordance with an additional embodiment. As shown, the die 410 may comprise a first IO interface 417A and a second IO interface 417B. The logic cores are omitted for simplicity. In an embodiment, an FLI pad 409 on the front side layers 401 may be coupled to an SLI pad 406 on the backside layers 403. In an embodiment, the signal path comprises a first portion 421. As shown, the first portion 421 passes through the front side layers 401 with pads and vias. That is, there may be minimal horizontal displacement with the first portion 421. For example, the vias may stagger or fan-out to a slightly larger pitch for the through glass vias, while still staying within the footprint under the die shadow.

In an embodiment, a second portion 422 may include a through glass via through the core 402. The through glass via may be substantially similar to the through glass vias described in greater detail above. For example, the through glass via of the second portion 422 may have vertical sidewalls, tapered sidewalls, or an hourglass shaped cross-section as shown in FIGS. 3B-3E above. In an embodiment, the through glass via of the second portion 422 may have the same or slightly larger or slightly smaller pitch and/or width as the FLI pad 409. In an embodiment, the second portion 422 is made through the core 402 within the shadow of the die 410.

In an embodiment, the signal path may continue with portion 423. The portion 423 may include a horizontal displacement. As shown, the portion 423 breaks out to be over an SLI pad 406. A last vertical portion 424 may connect the portion 423 to the SLI pad 406. In an embodiment, the SLI pad 406 may be within the shadow of the die 410. However, unlike instances described above, there is no need to break-out the signal path in the front side layers and break-in the signal path in the backside layers. Instead, a vertical path can be formed through the front side layers 401 and the core 402, and horizontal routing can be provided in the backside layers 403. It is to be appreciated that routing on the backside layers 403 is preferred since these metal layers are less critical for die 410 power delivery due to their greater physical distance from the active circuitry of the die. Moving the signal routing 421 to the backside layers 403 allows for a reduction in the number of layers on the front side.

Figure 5:
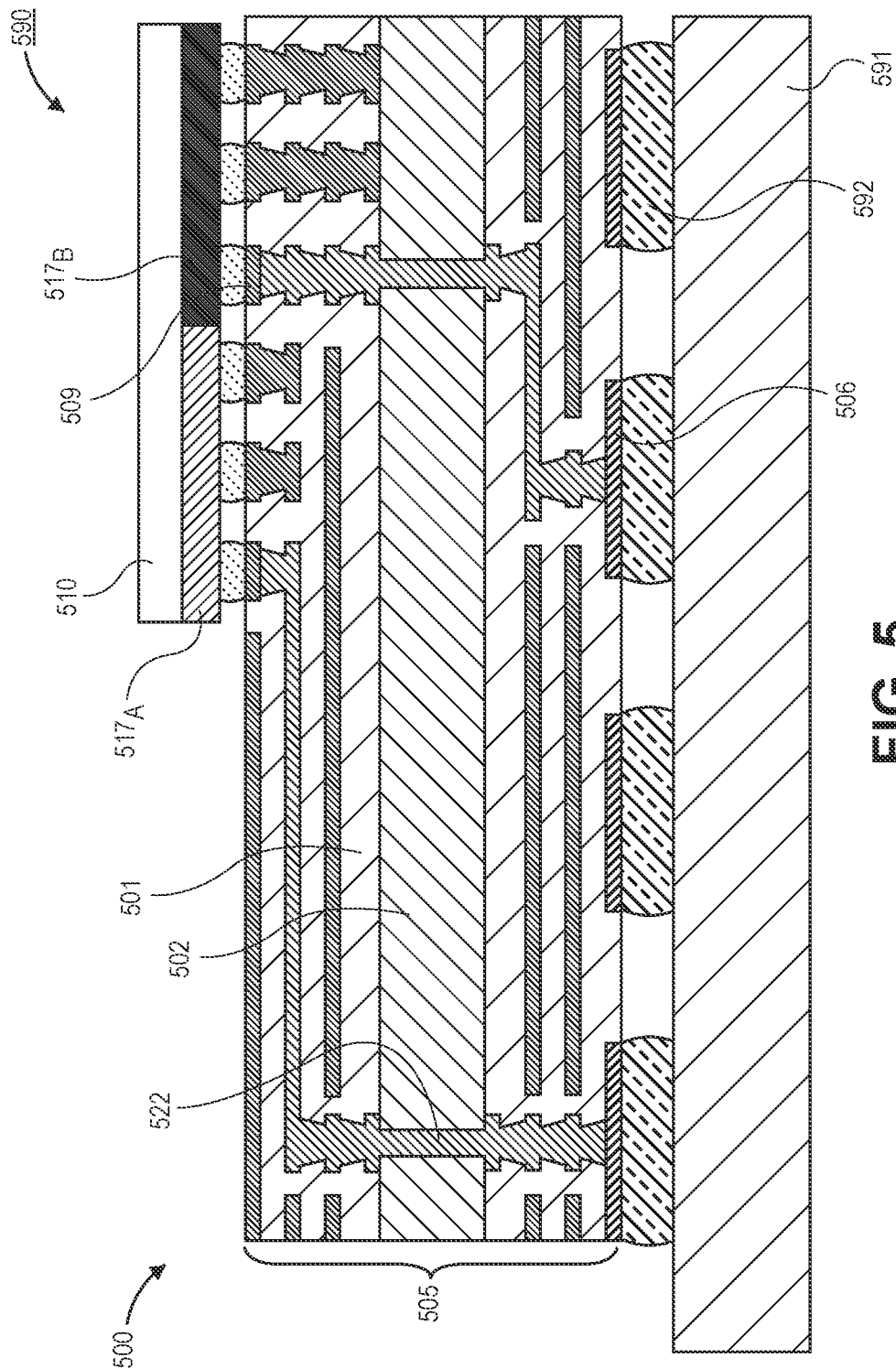
FIG. 5 is a cross-sectional illustration of an electronic system with a package substrate with a glass core via, in accordance with an embodiment.

Referring now to FIG. 5, a cross-sectional illustration of an electronic system 590 is shown, in accordance with an embodiment. The electronic system 590 may comprise a board 591, such as a printed circuit board (PCB). An electronic package 500 may be coupled to the board 591 by SLIs 592. In FIG. 5 the SLIs 592 are shown as solder balls, but it is to be appreciated that the SLIs 592 may comprise any architecture, such as sockets or the like. In an embodiment, the SLIs 592 are coupled to SLI pads 506. In an embodiment, the electronic package 500 comprises a die 510. A first IO interface 517A and a second IO interface 517E are shown. The IO interfaces may be coupled to a FLI pad 509. The FLI pads 509 may be coupled to a SLI pad 506 through a signal path through the package substrate 505. In a particular embodiment, the signal path includes through glass vias 522 that pass through a glass core 502. The through glass vias 522 may allow for a signal path that is vertical through the first layers 501, since the through glass vias 522 can match the pitch of the FLI pads 509.

As noted above, another issue with die modules is that the footprint of the die module may be shoreline limited. Shoreline limited devices are created by the requirement that the IO interfaces be placed on the die edge. IO interfaces need to be on the edge of the die so that the signal breakout from the bump field does not interfere with the breakout of other IO on the die edge and/or core/IO power delivery paths into the die. When routing signals buried deep in the bump field, the signal wires interfere with the vertical power delivery paths for any die circuits above them. The power delivery paths near the die, on the front side layers, ideally, should not be altered. Having to share metal resources for both signaling and vertical power delivery degrades the power delivery performance within the signal routing footprint. This can be exhibited in higher AC power loop inductance and/or higher DC voltage drop for those power rails.

The requirement to fan-out signals on the front side layers of the substrate is forced, in large part, by the disparity between the scale of the FLI bump pitch (e.g., 100 μm-150 μm) versus the scale of the through core via pitch (e.g., 250 μm-400 μm). Accordingly, embodiments disclosed herein leverage glass cores and through glass vias that can be patterned at bump pitch scale (e.g., 50 μm to 400 μm or 50 μm to 150 μm). This enables a seamless transition from the bump pattern to the backside layers of the substrate, which can be used to give the die floorplan much more flexibility to position signal interfaces off the die edge. This IO floorplan flexibility can result in reduced die size and helps to position IO for optimal system performance.

Non-standard sizes of the IO interfaces and the logic cores drive an increase in the die size that exceeds the theoretical circuit area limited requirement for a given device. In standard designs, these various sized IO interfaces need to be positioned on a die edge where the depth of the IO to core transition is often variable. The resulting profile of variable interface depths is sometimes referred to as an IO "skyline". The core logic blocks also come with fixed shapes and sizes and it can be difficult (or in some cases impossible) to fit the core logic blocks together with the IO skyline without having underutilized transistor area (white space). White space adds to the total die area requirement, resulting in larger die sizes.

Figure 6A:
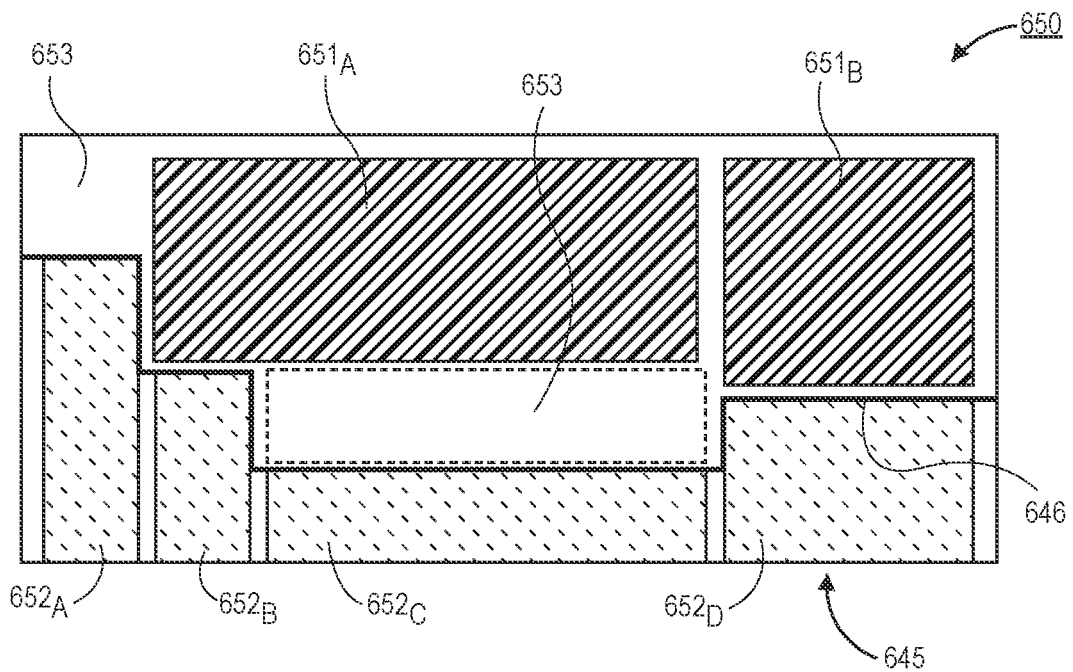
FIG. 6A is a plan view illustration of a die module that is shoreline limited by IO interfaces that must be along the edge of the die module, in accordance with an embodiment.

An example of such a shoreline limited die module 650 is shown in FIG. 6A. As shown, a set of IO interfaces 652A-652D are along the die module edge 645. The variable depth of the IO interfaces 652 into the die module 650 define the TO skyline 646 (indicated with a thick line for reference). Due to the variable IO skyline 646, the core logic blocks 651A and 651E cannot be placed in a manner to eliminate white space 653.

However, the wasted space generated by shoreline limited architectures can be reduced by moving one or more of the IO interfaces away from the die edge. Bump pitch scale through core vias enable IO interface placement off the die perimeter. This increases flexibility for IO and core logic block placement. As such a reduction (or elimination) of white space can be provided. The bump pitch scale through core vias allow for signal paths to drop through the front side layers without needing to fan out. As such, IO interfaces buried deep within the bump field can be routed directly to the backside layers without the need to disrupt the power delivery network.

Figure 6B:
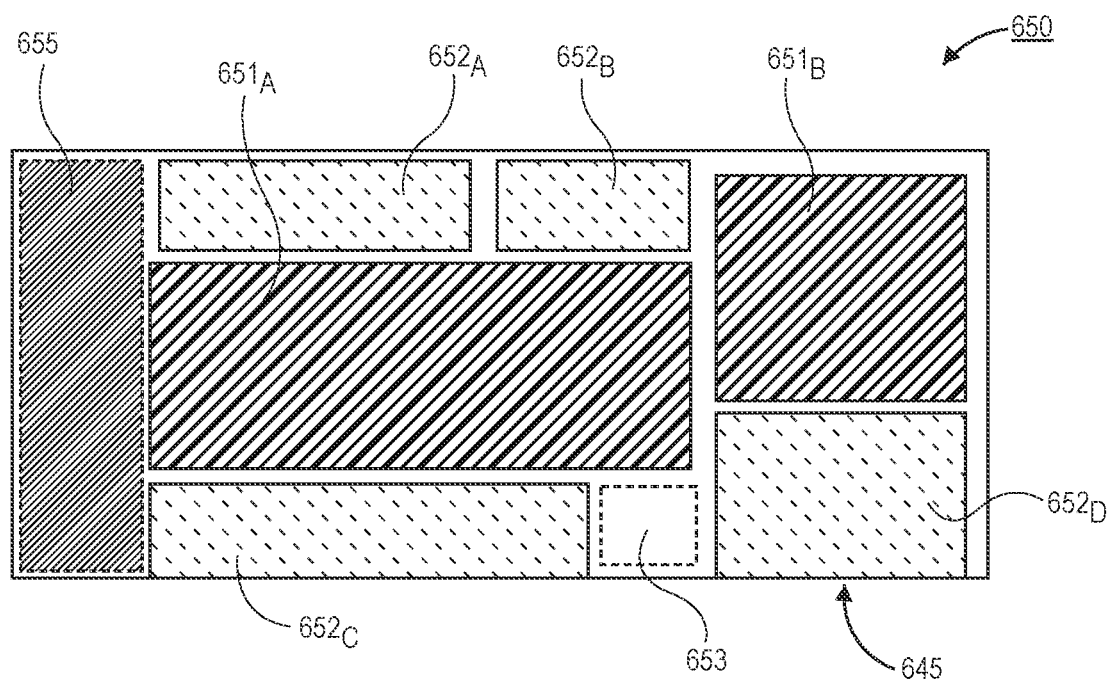
FIG. 6B is a plan view illustration of a die module with IO interfaces that can be freely placed away from the die edge, in accordance with an embodiment.

Referring now to FIG. 6B, a plan view illustration of a die module 650 that is arranged using design rules without the requirement that the IO interfaces 652 be on the die edge 645 is shown, in accordance with an embodiment. As shown, the IO interfaces 652A and 652B are rotated and placed within the die module 650. IO interfaces 652c and 652D may remain on the die edge 645. That is, a logic core 651A or 651E may be provided between an IO interface 652 and the edge 645 of the die module 650. The rearrangement of the IO interfaces 651 allows for a space savings as indicated by block 655. A smaller white space 653 is left as well. However, depending on the shapes and sizes of the IO interfaces 651 and the logic cores 652, all white space 653 may be omitted in some embodiments.

Additionally, increased proliferation of die disaggregation architectures increases the importance of efficient die tile-to-tile communication. The tile-to-tile channels can be wide and slow over a shorter channel length (e.g., embedded bridge architectures). Or the channels can be narrow and fast over a long channel connected through on-organic wires (i.e., package traces). In some architectures it is preferred to have IO interfaces buried within the bump field to maximize device performance. For example, high bandwidth memory (HBM), DRAM memory stacks, and some processor logic cores benefit from IO channels entering the die tile in a centralized location for minimal latency for accessing data on-die. In such architectures, currently existing packaging solutions need to balance the signal integrity with power delivery performance. However, through the use of through glass vias, the impact to the front side package layer power delivery can be avoided.

An example of one such embodiment is shown in FIG. 7A. FIG. 7A is a cross-sectional illustration of an electronic package 760 that includes die-to-die communications between a first die 750A and a second die 750B, in accordance with an embodiment. As shown, vertical connections 721 extend down from the dies 750 through the front side layers 701. Since the connections 721 are vertical with a minimal lateral component (e.g., the vias remain within the footprint of the IO interface on the dies), there is substantially no interference with routing between the power delivery circuitry 708 (e.g., air core inductors, etc.) in the core 702 and the dies 750. As such, power delivery performance is maintained while still allowing for buried IO interfaces within the bump field of the dies 750.

Vertical connections through the front side layers 701 are enabled by the presence of through core vias 722 that have substantially the same pitch as the FLI bump pitch. Particularly, the through core vias 722 may be through glass vias. The through glass vias may be substantially similar to the through glass vias described in greater detail above, with respect to FIGS. 3B and 3C. That is, the through core vias 722 may comprise substantially vertical sidewalls, tapered sidewalls, or an hourglass shaped cross-section. In an embodiment, the through glass vias may be fabricated using a laser assisted etching process, as described above.

After passing through the core 702, the IO signal traces from both dies 750A and 750E may laterally connect with each other in the backside layers 703 with lateral traces 723. The lateral traces 723A and 723B illustrate the die-to-die connections. It is to be appreciated that additional lateral connections can be made to provide the necessary number of connections between the dies 750A and 750B. Using the backside layers for the lateral traces allows for the routing to occur with minimal impact to the power delivery network.

Figure 7B:
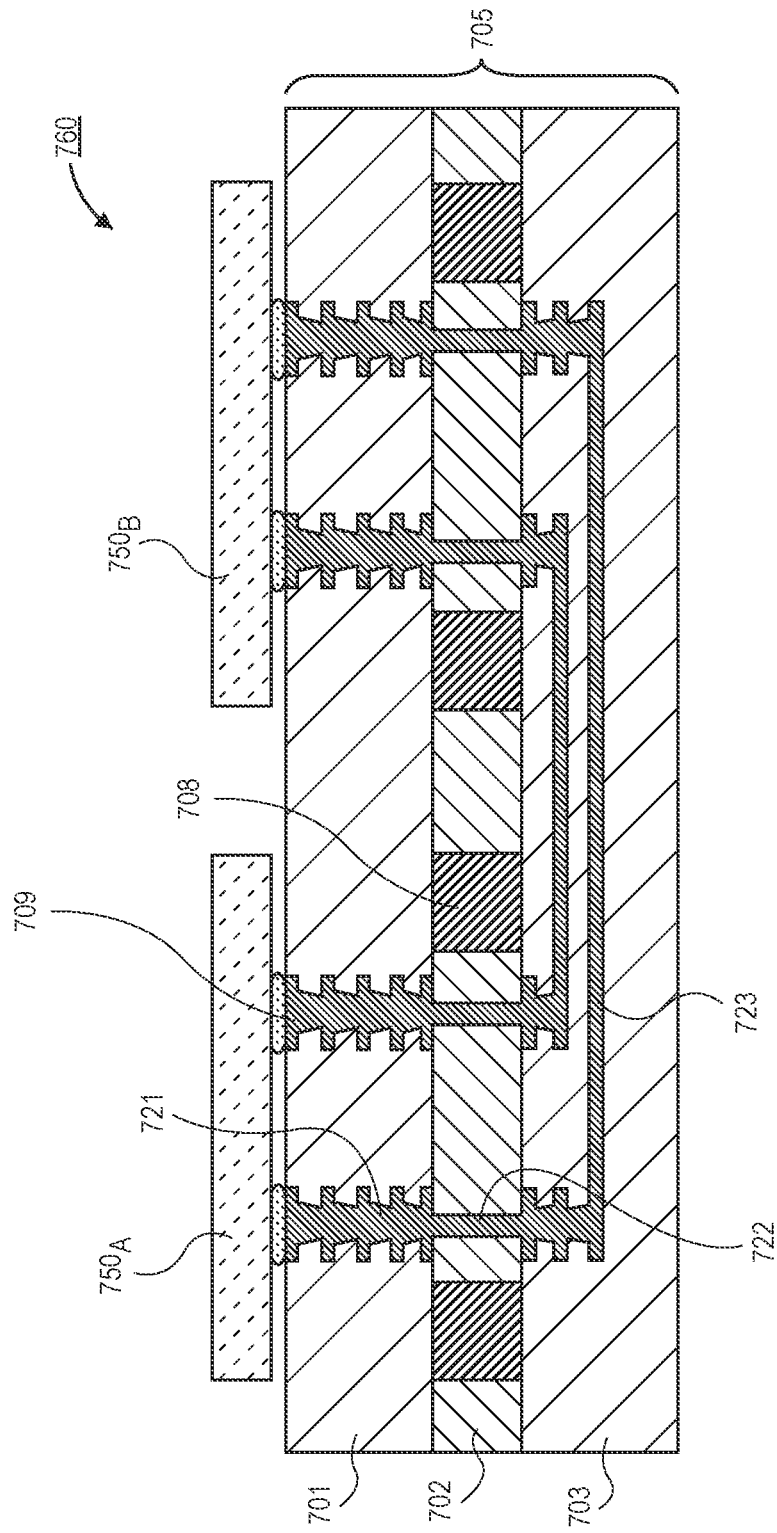
FIG. 7B is a detailed cross-sectional illustration of an electronic package with a first die module that is electrically coupled to a second die module with signal connectivity on the backside metal layers of the substrate after passing through glass core vias, in accordance with an embodiment.

Referring now to FIG. 7B, a cross-sectional illustration illustrating a pair of connections between a first die 750A and a second die 750E is shown, in accordance with an additional embodiment. As shown, vertical connections 721 pass through the first layers 701. The vertical connections 721 may comprise a series of pads and traces stacked vertically, or with the pads and traces staggered, but still within the footprint of the IO interface. That is, in some embodiments, there is no horizontal translation (or minimal horizontal translation) of the signal path within the front side layers 701. In an embodiment, the signal path continues with a through glass via 722. As noted above, the through glass vias 722 may have a pitch substantially equal to the pitch of the FLI pads 709. For example, the through glass vias 722 may have a pitch that is approximately 50 μm to 400 μm or approximately 50 μm to 150 μm. In an embodiment, the backside of the through glass vias 722 may be coupled to horizontal traces 723. The horizontal traces 723 may couple together through glass vias 722 below different dies 750.

As shown in FIG. 7B, the communication paths between the two dies 750A and 750E do not intersect a path between the power delivery circuitry 708 in the core 702 and the dies 750. As such, communication resources do not need to be balanced against power delivery in order to enable a high-performance device.

Figure 8:
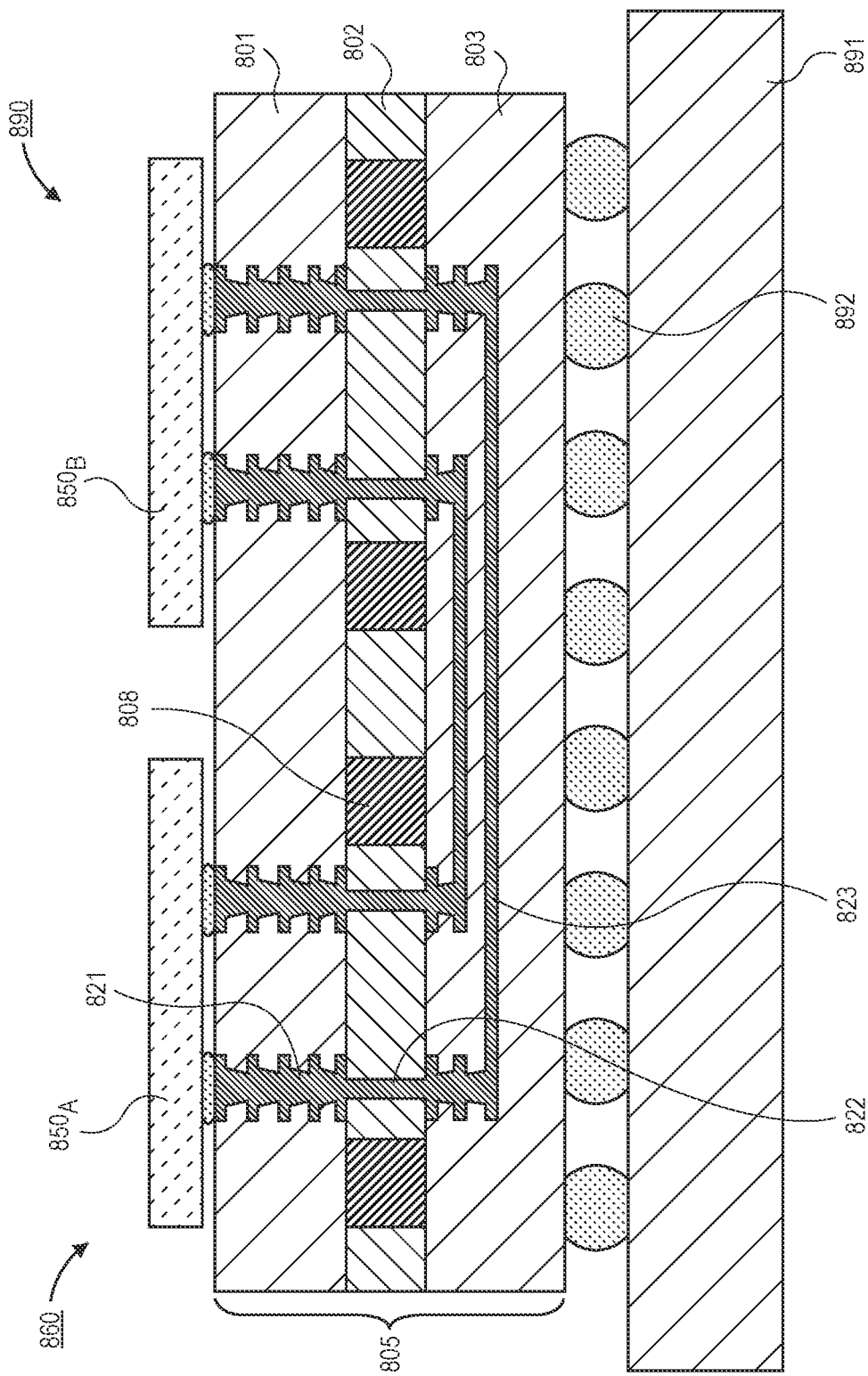
FIG. 8 is a cross-sectional illustration of an electronic system with a first die module that is electrically coupled to a second die module through vias through a glass core, in accordance with an embodiment.

Referring now to FIG. 8, a cross-sectional illustration of an electronic system 890 is shown, in accordance with an embodiment. In an embodiment, the electronic system 890 comprises a board 891, such as a PCB. In an embodiment, the board 891 is coupled to an electronic package 860 by SLIs 892. While solder balls are shown, it is to be appreciated that the SLIs 892 may comprise other architectures, such as sockets or the like. In an embodiment, the SLIs 892 may be coupled to a backside layer 803 of a package substrate 805. The electronic package 860 may further comprise a pair of dies 850A and 850B.

In an embodiment, the die 850A may be communicatively coupled to the die 850E by a communication path formed in the package substrate 805. In an embodiment, vertical connections 821 are formed through the front side layers 801 of the package substrate 805. In an embodiment, the vertical connections 821 do not have any horizontal displacement in order to not disrupt routing (not shown) between power circuitry 808 and the dies 850.

In an embodiment, the vertical connections 821 couple with through glass vias 822 that pass through the core 802. In an embodiment, the through glass vias 822 may be substantially similar to the through glass vias described above with respect to FIGS. 3B and 3C. In an embodiment, the through glass vias 822 may have a pitch that is substantially equal to the pitch of FLI pads. In an embodiment, the through glass vias 822 below the first die 850A may be coupled to the through glass vias 822 below the second die 850E by horizontal traces 823 in the backside layers 803 of the package substrate 805.

Figure 9:
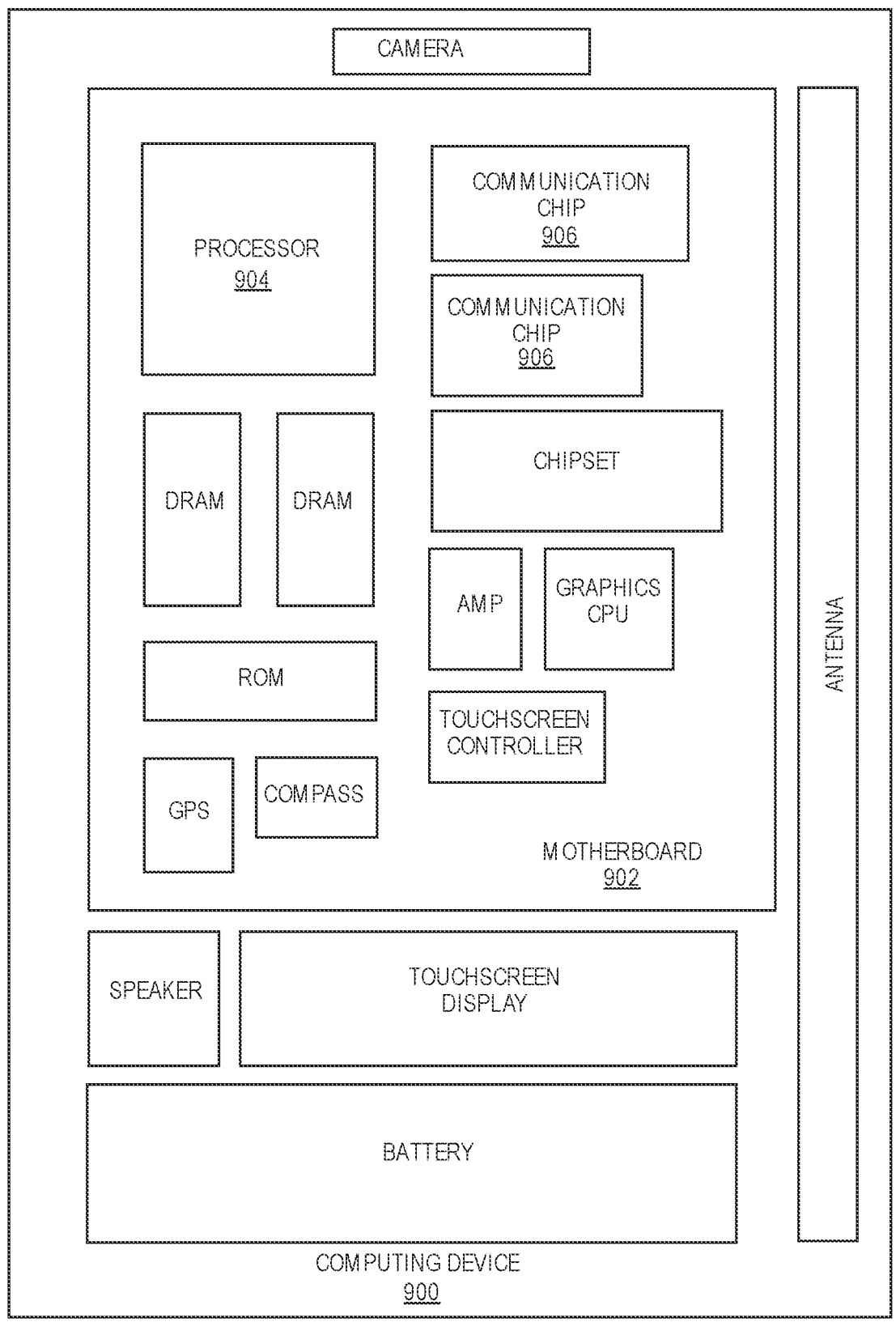
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be part of an electronic package that comprises a glass core with through glass vias that have a pitch substantially equal to a pitch of FLIs between the integrated circuit die and the package substrate, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be part of an electronic package that comprises a glass core with through glass vias that have a pitch substantially equal to a pitch of FLIs between the integrated circuit die and the package substrate, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a disaggregated die module, comprising: a plurality of core logic blocks; a first IO interface, wherein the first IO interface is adjacent to an edge of the disaggregated die module; and a second IO interface, wherein the second IO interface is set away from the edge of the disaggregated die module.

Example 2: the disaggregated die module of Example 1, wherein a footprint of the first IO interface is different than a footprint of the second IO interface.

Example 3: the disaggregated die module of Example 1 or Example 2, further comprising: a package substrate under the disaggregated die module.

Example 4: the disaggregated die module of Example 3, wherein the package substrate comprises: front side layers, wherein the front side layers comprise a dielectric material; a core, wherein the core comprises glass; and backside layers, wherein the backside layer comprise a dielectric material.

Example 5: the disaggregated die module of Example 4, wherein the second IO interface is coupled to vias through the core by conductive routing in the front side layers.

Example 6: the disaggregated die module of Example 5, wherein the conductive routing vertically drops from the second IO interface to the vias without moving outside of a shadow of the second IO interface.

Example 7: the disaggregated die module of Example 5 or Example 6, wherein the vias have a tapered cross-section or a rectangular cross-section.

Example 8: the disaggregated die module of Example 5 or Example 6, wherein the vias have an hourglass shaped cross-section.

Example 9: the disaggregated die module of Examples 5-8, wherein die-to-die routing in the backside layers is coupled to the vias.

Example 10: the disaggregated die module of Examples 1-9, wherein the first TO interface is separated from the second TO interface by at least one of an additional TO interface or a core circuit block.

Example 11: an electronic package, comprising: a package substrate, wherein the package substrate comprises: a core, wherein the core comprises glass; front side layers over the core, wherein the front side layers comprise a dielectric material; and backside layers under the core, wherein the backside layers comprise a dielectric material; a first die module over the package substrate, wherein the first die module comprises: a first TO interface that is set away from an edge of the first die module; a second die module over the package substrate, wherein the second die module comprises: a second TO interface that is set away from an edge of the second die module; and a communication link between the first TO interface and the second TO interface, wherein the communication link includes vertical components in the front side layers and horizontal components in the backside layers.

Example 12: the electronic package of Example 11, wherein the vertical components are coupled to the horizontal components by vias through the core.

Example 13: the electronic package of Example 12, wherein the vias are within a footprint of the first TO interface or within a footprint of the second TO interface.

Example 14: the electronic package of Example 12 or Example 13, wherein the vias have an hourglass shaped cross-section.

Example 15: the electronic package of Examples 12-14, further comprising: a power delivery structure embedded in the core, wherein the power delivery structure is not within a shadow of the die-to-die TO.

Example 16: the electronic package of Example 15, wherein the air core inductors are within a footprint of the first die module and the second die module.

Example 17: the electronic package of Example 15 or Example 16, wherein the first die module further comprises: a third TO interface, wherein a shape of the first TO interface is different than a shape of the third TO interface.

Example 18: an electronic system, comprising: a board; a package substrate coupled to the board, wherein the package substrate comprises: front side layers, wherein the front side layers comprise a dielectric material; a core, wherein the core comprises glass; and backside layers, wherein the backside layer comprise a dielectric material; and a die module coupled to the package substrate, wherein the die module comprises: a plurality of core logic blocks; a first TO interface, wherein the first TO interface is adjacent to an edge of the die module; and a second TO interface, wherein the second TO interface is set away from the edge of the die module.

Example 19: the electronic system of Example 18, wherein the second TO interface is coupled to vias through the core by conductive routing in the front side layers.

Example 20: the electronic system of Example 19, wherein the vias are within a footprint of the second TO interface.

What is claimed is:

1. A disaggregated die module, comprising:
a plurality of core logic blocks;
a first IO interface, wherein the first IO interface is adjacent to an edge of the disaggregated die module;
a second IO interface, wherein the second IO interface is set away from the edge of the disaggregated die module, wherein the second IO interface and the first IO interface are outside of a footprint of the plurality of core logic blocks; and
a package substrate under the disaggregated die module, wherein the package substrate comprises:
front side layers, wherein the front side layers comprise a dielectric material;
a core, wherein the core comprises glass; and
backside layers, wherein the backside layer comprise a dielectric material.

2. The disaggregated die module of claim 1, wherein a footprint of the first IO interface is different than a footprint of the second IO interface.

3. The disaggregated die module of claim 1, wherein the second IO interface is coupled to vias through the core by conductive routing in the front side layers.

4. The disaggregated die module of claim 3, wherein the conductive routing vertically drops from the second IO interface to the vias without moving outside of a shadow of the second IO interface.

5. The disaggregated die module of claim 3, wherein the vias have a tapered cross-section or a rectangular cross-section.

6. The disaggregated die module of claim 3, wherein the vias have an hourglass shaped cross-section.

7. The disaggregated die module of claim 3, wherein die-to-die routing in the backside layers is coupled to the vias.

8. The disaggregated die module of claim 1, wherein the first IO interface is separated from the second IO interface by at least one of an additional IO interface or a core circuit block.

9. An electronic system, comprising:
a board;
a package substrate coupled to the board, wherein the package substrate comprises:
front side layers, wherein the front side layers comprise a dielectric material;
a core, wherein the core comprises glass; and
backside layers, wherein the backside layer comprise a dielectric material; and
a die module coupled to the package substrate, wherein the die module comprises:
a plurality of core logic blocks;
a first IO interface, wherein the first IO interface is adjacent to an edge of the die module; and
a second IO interface, wherein the second IO interface is set away from the edge of the die module, wherein the second IO interface and the first IO interface are outside of a footprint of the plurality of core logic blocks.

10. The electronic system of claim 9, wherein the second IO interface is coupled to vias through the core by conductive routing in the front side layers.

11. The electronic system of claim 10, wherein the vias are within a footprint of the second IO interface.

12. A disaggregated die module, comprising:
a plurality of core logic blocks;
a first IO interface, wherein the first IO interface is adjacent to an edge of the disaggregated die module;
a second IO interface, wherein the second IO interface is set away from the edge of the disaggregated die module; and
a package substrate under the disaggregated die module, wherein the package substrate comprises:
front side layers, wherein the front side layers comprise a dielectric material;
a core, wherein the core comprises glass; and
backside layers, wherein the backside layer comprise a dielectric material, wherein the second IO interface is coupled to vias through the core by conductive routing in the front side layers.

13. The disaggregated die module of claim 12, wherein the conductive routing vertically drops from the second IO interface to the vias without moving outside of a shadow of the second IO interface.

14. The disaggregated die module of claim 12, wherein the vias have a tapered cross-section or a rectangular cross-section.

15. The disaggregated die module of claim 12, wherein the vias have an hourglass shaped cross-section.

16. The disaggregated die module of claim 12, wherein die-to-die routing in the backside layers is coupled to the vias.

* * * * *